United States Patent
Kim et al.

(10) Patent No.: US 9,852,921 B2
(45) Date of Patent: Dec. 26, 2017

(54) SUBSTRATE TREATING APPARATUS AND METHOD OF TREATING SUBSTRATE

(71) Applicant: SAMSUNG ELECTRONICS CO., LTD., Suwon-si, Gyeonggi-do (KR)

(72) Inventors: Kyoung Hwan Kim, Yongin-si (KR); Ingi Kim, Hwaseong-si (KR); Mihyun Park, Seongnam-si (KR); Young-Hoo Kim, Yongin-si (KR); Ui-soon Park, Suwon-si (KR); Jung-Min Oh, Incheon (KR); Kuntack Lee, Suwon-si (KR); Hyosan Lee, Hwaseong-si (KR)

(73) Assignee: SAMSUNG ELECTRONICS CO., LTD., Suwon-Si, Gyeonggi-Do (KR)

(*) Notice: Subject to any disclaimer, the term of this patent is extended or adjusted under 35 U.S.C. 154(b) by 0 days.

(21) Appl. No.: 15/175,062

(22) Filed: Jun. 7, 2016

(65) Prior Publication Data
US 2017/0062287 A1    Mar. 2, 2017

(30) Foreign Application Priority Data

Sep. 2, 2015 (KR) .......................... 10-2015-0124255

(51) Int. Cl.
| | | |
|---|---|---|
| *G01N 15/06* | (2006.01) | |
| *G01N 33/00* | (2006.01) | |
| *G01N 33/48* | (2006.01) | |
| *H01L 21/311* | (2006.01) | |
| *H01L 21/67* | (2006.01) | |

(52) U.S. Cl.
CPC .. *H01L 21/31111* (2013.01); *H01L 21/67086* (2013.01); *H01L 21/67253* (2013.01); *H01L 21/67288* (2013.01)

(58) Field of Classification Search
CPC combination set(s) only.
See application file for complete search history.

(56) References Cited

U.S. PATENT DOCUMENTS

| | | | |
|---|---|---|---|
| 6,001,215 A | 12/1999 | Ban | |
| 6,749,716 B2 | 6/2004 | Ottow et al. | |
| 7,713,478 B2 * | 5/2010 | Watatsu | H01L 22/14 216/99 |
| 8,008,087 B1 | 8/2011 | Shalyt et al. | |

(Continued)

FOREIGN PATENT DOCUMENTS

| | | | |
|---|---|---|---|
| JP | 2001274137 A | * 10/2001 | |
| JP | 2013-041923 A | 2/2013 | |

(Continued)

*Primary Examiner* — Telly Green
(74) *Attorney, Agent, or Firm* — Lee & Morse, P.C.

(57) ABSTRACT

A substrate treating apparatus and a method of treating a substrate, the apparatus including a substrate treater that treats a substrate using a chemical solution, the chemical solution including a phosphoric acid aqueous solution and a silicon compound; and a chemical solution supplier that supplies the chemical solution to the substrate treating unit, wherein the chemical solution supplier includes a concentration measurer that measures concentrations of the chemical solutions, the concentration measurer including a first concentration measurer that measures a water concentration of the chemical solution; and a second concentration measurer that measures a silicon concentration of the chemical solution.

18 Claims, 15 Drawing Sheets

(56) References Cited

U.S. PATENT DOCUMENTS

| | | | |
|---|---|---|---|
| 8,105,851 B1 | 1/2012 | Ku et al. | |
| 8,409,997 B2 | 4/2013 | Wei et al. | |
| 2002/0059943 A1* | 5/2002 | Inagaki | B08B 3/08 134/18 |
| 2006/0263251 A1* | 11/2006 | Watatsu | H01L 22/14 422/68.1 |
| 2013/0240143 A1 | 9/2013 | Kiyose et al. | |
| 2013/0255882 A1 | 10/2013 | Takahashi et al. | |
| 2016/0351412 A1* | 12/2016 | Lee | H01L 21/31111 |

FOREIGN PATENT DOCUMENTS

| | | |
|---|---|---|
| JP | 2013-165217 A | 8/2013 |
| JP | 2015-070119 A | 4/2015 |

* cited by examiner

SUBSTRATE TREATING APPARATUS AND METHOD OF TREATING SUBSTRATE

CROSS-REFERENCE TO RELATED APPLICATION

Korean Patent Application No. 10-2015-0124255, filed on Sep. 2, 2015, in the Korean Intellectual Property Office, and entitled: "Substrate Treating Apparatus and Method of Treating Substrate," is incorporated by reference herein in its entirety.

BACKGROUND

1. Field

Embodiments relate to a substrate treating apparatus and a method of treating a substrate.

2. Description of the Related Art

As semiconductor memory devices are highly integrated, reliability and electrical characteristics of semiconductor memory devices may be greatly affected by damage and variation of components constituting the semiconductor memory devices.

SUMMARY

Embodiments are directed to a substrate treating apparatus and a method of treating a substrate.

The embodiments may be realized by providing a substrate treating apparatus including a substrate treater that treats a substrate using a chemical solution, the chemical solution including a phosphoric acid aqueous solution and a silicon compound; and a chemical solution supplier that supplies the chemical solution to the substrate treating unit, wherein the chemical solution supplier includes a concentration measurer that measures concentrations of the chemical solutions, the concentration measurer including a first concentration measurer that measures a water concentration of the chemical solution; and a second concentration measurer that measures a silicon concentration of the chemical solution.

The embodiments may be realized by providing a method of treating a substrate, the method including supplying a chemical solution to a substrate to perform a process on the substrate, the chemical solution including a silicon compound and a phosphoric acid aqueous solution; circulating the chemical solution; sampling at least a portion of the circulated chemical solution; measuring a water concentration and a silicon concentration of the sampled chemical solution; and processing concentration data of the chemical solution based on the water concentration and the silicon concentration.

The embodiments may be realized by providing a method of treating a substrate, the method including supplying a chemical solution to a substrate to perform a process on the substrate, the chemical solution including a silicon compound and a phosphoric acid aqueous solution; circulating the chemical solution; sampling at least a portion of the circulated chemical solution; and measuring a water concentration and a silicon concentration of the sampled chemical solution, wherein measuring the silicon concentration includes preventing a measurement error of the silicon concentration and preventing a silicon deposit, which occur by the silicon concentration increasing during the process.

The embodiments may be realized by providing a method of treating a substrate, the method including supplying a chemical solution to a substrate to perform a process on the substrate, the chemical solution including a silicon compound and a phosphoric acid aqueous solution; circulating the chemical solution; sampling at least a portion of the circulated chemical solution; and measuring a water concentration and a silicon concentration of the sampled chemical solution, wherein performing the process on the substrate increases the silicon concentration of the chemical solution, and measuring the silicon concentration includes cleaning a silicon concentration measurer that measures the silicon concentration.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
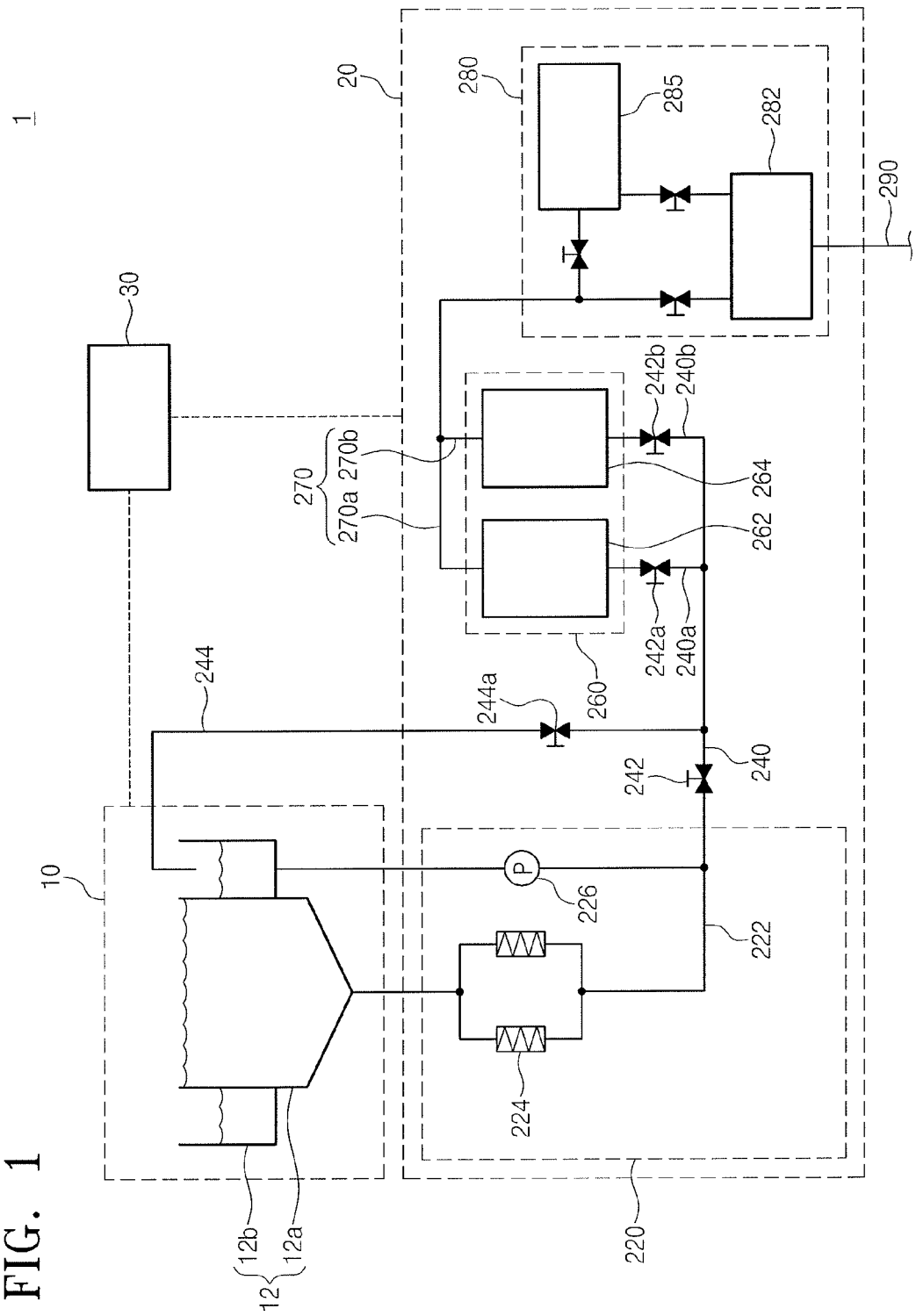
FIG. 1 illustrates a schematic block diagram of a substrate treating apparatus according to some embodiments.
Figure 2:
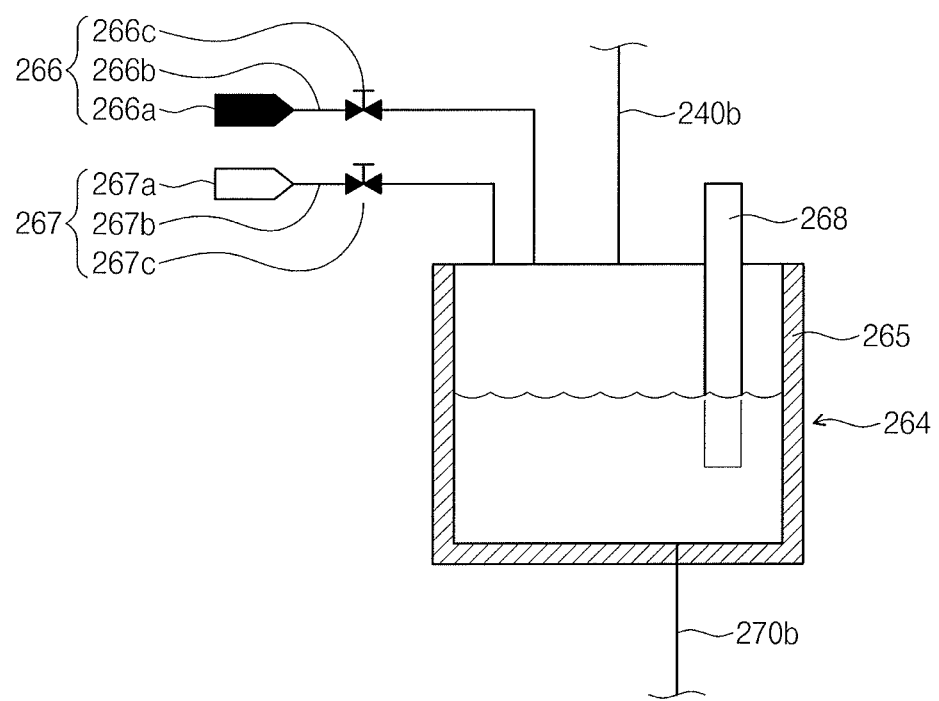
FIG. 2 illustrates an enlarged view of a second concentration measuring part of FIG. 1.
Figure 3:
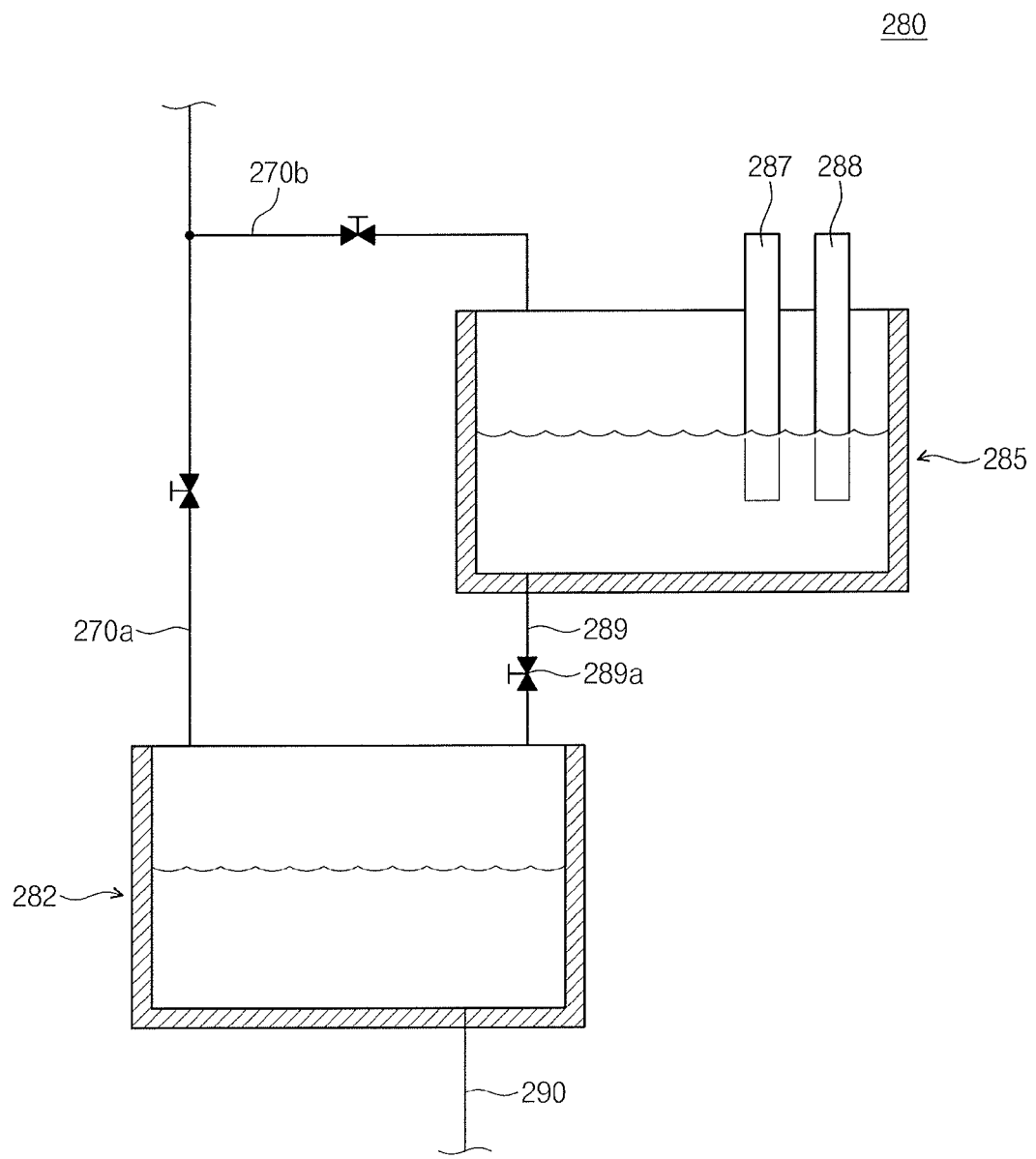
FIG. 3 illustrates an enlarged view of a waste solution treating part of FIG. 1.

FIG. 1 illustrates a schematic block diagram of a substrate treating apparatus 1 according to some embodiments. FIG. 2 illustrates an enlarged view of a second concentration measuring part or second concentration measurer 264 of FIG. 1. FIG. 3 illustrates an enlarged view of a waste solution treating part or waste solution treater 280 of FIG. 1. The substrate treating apparatus 1 will be described with reference to FIGS. 1 to 3 hereinafter. The substrate treating apparatus 1 may include a substrate treating unit or a substrate treater 10, a chemical solution supply unit or chemical solution supplier 20, and a control unit or controller 30.

The substrate treating unit 10 may include a bath 12. The bath 12 may include a main bath 12a and an assistant or auxiliary bath 12b. A process of treating a substrate may be performed using a chemical solution in the main bath 12a. In some embodiments, an etching process may be performed on a substrate in the main bath 12a. In some embodiments, at least one of various processes of treating a substrate using a chemical solution may be performed in the main bath 12a. A chemical solution may be provided into the main bath 12a, and a substrate may be immersed in the chemical solution so as to be treated. The chemical solution may include a phosphoric acid aqueous solution and a silicon compound. The chemical solution may include a high-concentration silicon compound. For example, the chemical solution may include the silicon compound in a concentration of about 80 ppm to about 1,000 ppm. The chemical solution may be controlled or maintained at a high temperature to treat the substrate. For example, the temperature of the chemical solution may be controlled to be maintained at about 150° C. to about 200° C. For example, the process of using the chemical solution may be performed at a temperature of about 150° C. to about 200° C.

A treating process may be performed on a plurality of substrates at the same time in the main bath 12a. The assistant bath 12b may receive a chemical solution overflowing from the main bath 12a. The bath 12 may be formed of a material with excellent thermal stability. In an implementation, a coating layer may be provided on inner surfaces of the bath 12.

The chemical solution supply unit 20 may include a chemical solution circulating part or chemical solution circulator 220, a sampling line 240, a concentration measuring part or concentration measurer 260, and a waste solution treating part or waste solution treater 280. The chemical solution circulating part 220 may circulate a chemical solution provided into the substrate treating unit 10. For example, the chemical solution circulating part 220 may circulate a chemical solution exhausted from the main bath 12a and may then re-provide the circulated chemical solution to the assistant bath 12b. The chemical solution may be controlled to have a suitable process condition while the chemical solution is circulated in the chemical solution circulating part 220. For example, a temperature and/or a concentration of the chemical solution may be controlled or adjusted while the chemical solution is circulated in the chemical solution circulating part 220. The chemical solution circulating part 220 may include a circulating line 222, a circulating heater 224, and a pump 226. One end of the circulating line 222 may be connected to the bath 12, and another end of the circulating line 222 may also be connected to the bath 12. The circulating heater 224 and the pump 226 may be provided on the circulating line 222. The circulating heater 224 may heat a chemical solution in the circulating line 222. The pump 226 may adjust a flow rate of a chemical solution re-provided into the substrate treating unit 10. In an implementation, a filter may be installed on the circulating line 222.

The sampling line 240 may be connected to the chemical solution circulating part 220 and the concentration measuring part 260. At least a portion of the chemical solution circulated in the chemical solution circulating part 220 may be sampled through the sampling line 240 so as to be provided into the concentration measuring part 260. An on-off valve 242 may be provided on the sampling line 240. A first sampling line 240a and a second sampling line 240b may branch off from the sampling line 240. The first sampling line 240a and the second sampling line 240b may be respectively connected to a first concentration measuring part 262 and a second concentration measuring part 264 which will be described below. A first sampling valve 242a and a second sampling valve 242b may be provided on the first sampling line 240a and the second sampling line 240b, respectively. An addition line 244 (connected to the assistant bath 12b) may be connected to the sampling line 240 between the on-off valve 242 and the sampling valves 242a and 242b. By operating an additional valve 244a on the additional line 244, a flow rate of a chemical solution may be adjusted and/or the chemical solution may be provided into the assistant bath 12b.

The concentration measuring part 260 may include a first concentration measuring part or first concentration measurer 262 and a second concentration measuring part or second concentration measurer 264. The first concentration measuring part 262 and the second concentration measuring part 264 may be connected in parallel to each other. The concentration measuring part 260 may sample a chemical solution to measure a concentration of the chemical solution. The first concentration measuring part 262 may measure a water concentration of the chemical solution. The first concentration measuring part 262 may include an optical measuring part. For example, the first concentration measuring part 262 may include an optical measuring part or optical measurer using near-infrared rays. For example, the first concentration measuring part 262 may irradiate the near-infrared rays to the chemical solution and may measure an absorption degree (i.e., an absorbance) from a wavelength band of a near-infrared ray, absorbed by water, among near-infrared rays reflected from the chemical solution. The first concentration measuring part 262 may convert the measured absorbance into a water content to measure the water concentration.

Referring to FIGS. 1 and 2, the second concentration measuring part 264 may measure a silicon concentration of the chemical solution. The second concentration measuring part 264 may include a reactor 265, a reagent supply part or reagent supplier 266, a correction chemical solution supply part or correction chemical solution supplier 267, and a measurement electrode 268. The reactor 265 may have a bath shape. The reactor 265 may have a space for receiving a chemical solution, a reagent, and a correction chemical solution. The reagent supply part 266 may include a reagent supply source 266a, a reagent supply line 266b, and a reagent supply valve 266c. The reagent supply line 266b may connect the reagent supply source 266a to the reactor 265 and may supply the reagent into the reactor 265. The reagent supply valve 266c may be installed on the reagent supply line 266b to control a supply of the reagent. The reagent may react with the chemical solution. The reagent may dissolve silicon included or dispersed in the chemical solution. For example, the reagent may contain fluorine ions. The reagent may include an acid solution. A ratio of the reagent to the chemical solution may range from about 0.5:1 to about 1.5:1. The reagent may be maintained at a setting or predetermined temperature. The setting temperature may be a temperature capable of dissolving the silicon of the chemical solution. For example, the setting temperature may be about 35° C. to about 43° C. The measurement electrode 268 may measure the silicon concentration of the chemical solution reacted with the reagent. The measurement electrode 268 may be an ion selective electrode. The ion selective electrode may be an electrode of which a potential is varied according to a concentration of specific ions. For example, when the silicon included in the chemical solution is dissolved to react with the fluorine ions of the reagent, a potential according to the amount of the fluorine ions remaining in the reactor 265 may be measured through the measurement electrode 268. The concentration of the silicon may be back-tracked or determined using the amount of the fluorine ions reacted with the chemical solution. For example, the measurement electrode 268 may include lanthanum (La). The measurement electrode 268 may compare a potential of a reference electrode and the potential of the measurement electrode 268 after the measurement to measure a potential difference therebetween. In an implementation, the second concentration measuring part 264 may further include a heater. In certain embodiments, the reagent may extract the (e.g., excess) silicon included in the chemical solution.

The correction chemical solution supply part 267 may include a correction chemical solution supply source 267a, a correction chemical solution supply line 267b, and a correction chemical solution supply valve 267c. The correction chemical solution supply line 267b may connect the correction chemical solution supply source 267a to the reactor 265 and may provide the correction chemical solution into the reactor 265. The correction chemical solution supply valve 267c may be installed on the correction chemical solution supply line 267b to control a supply of the correction chemical solution. The correction chemical solution may be the same as the chemical solution. The correction chemical solution may have the same concentrations as or different concentrations from the chemical solution. The correction chemical solution may include silicon of a predetermined concentration.

Referring to FIGS. 1 and 3, a waste solution of which the concentration measurement is or has been completed in the concentration measurement part 260 may be exhausted into the waste solution treating part 280. The waste solution may include at least one of the chemical solution, the reagent, or the correction chemical solution. The waste solution treating part 280 may include a collection line 270, a first collection tank 282, a second collection tank 285, a third collection line 289, and an exhaust line 290. The waste solution treating part 280 may exhaust the waste solution in such a way to help prevent silicon from being extracted, precipitated, or separated from the chemical solution including high-concentration silicon.

The collection line 270 may connect the concentration measuring part 260 to the waste solution treating part 280. The collection line 270 may connect the concentration measuring part 260 to the first and second collection tanks 282 and 285 to supply the waste solution that has been completely measured in the concentration measuring part 260 into the first and second collection tanks 282 and 285. The collection line 270 may include a first collection line 270a and a second collection line 270b. The first collection line 270a may connect the first concentration measuring part 262 to the first collection tank 282, and the second collection line 270b may connect the second concentration measuring part 264 to the second collection tank 285. As illustrated in FIG. 3, in an implementation, the first and second collection lines 270a and 270b may share a portion. In an implementation, the first and second collection lines 270a and 270b may be provided independently of each other.

The first collection tank 282 may collect the waste solution measured in the first concentration measuring part 262. At this time, the waste solution collected in the first collection tank 282 may include the chemical solution. The second collection tank 285 may collect the waste solution measured in the second concentration measuring part 264. At this time, the waste solution collected in the second collection tank 285 may include at least one of the chemical solution, the reagent, or the correction chemical solution. For example, the waste solution exhausted from the second concentration measuring part 264 may be a mixed solution of the chemical solution and the reagent. The second collection tank 285 may include a temperature sensor 287 and a heater 288. The temperature sensor 287 and the heater 288 may adjust a temperature of the second collection tank 285 such that the temperature of the second collection tank 285 meets a setting or predetermined temperature. The setting temperature may be a temperature at which the reagent included in the waste solution dissolves silicon included in the chemical solution and/or the correction chemical solution. For example, the setting temperature may range from about 35° C. to about 43° C. The third collection line 289 may connect the first collection tank 282 to the second collection tank 285. When an additional dissolution operation is completed in the second collection line 285, a collection valve 289a installed on the third collection line 289 may be opened to supply the waste solution from the second collection tank 285 into the first collection tank 282. The additional dissolution operation may help ensure that silicon included in the waste solution received in the second collection tank 285 is additionally dissolved. The exhaust line 290 may extend from the first collection tank 282. The exhaust line 290 may exhaust the waste solutions mixed with each other in the first collection tank 282 to the outside. In an implementation, the exhaust line 290 may be connected to a main exhaust line in the substrate treating apparatus 1. In an implementation, the exhaust line 290 may be connected directly to the main exhaust line.

Figure 4:
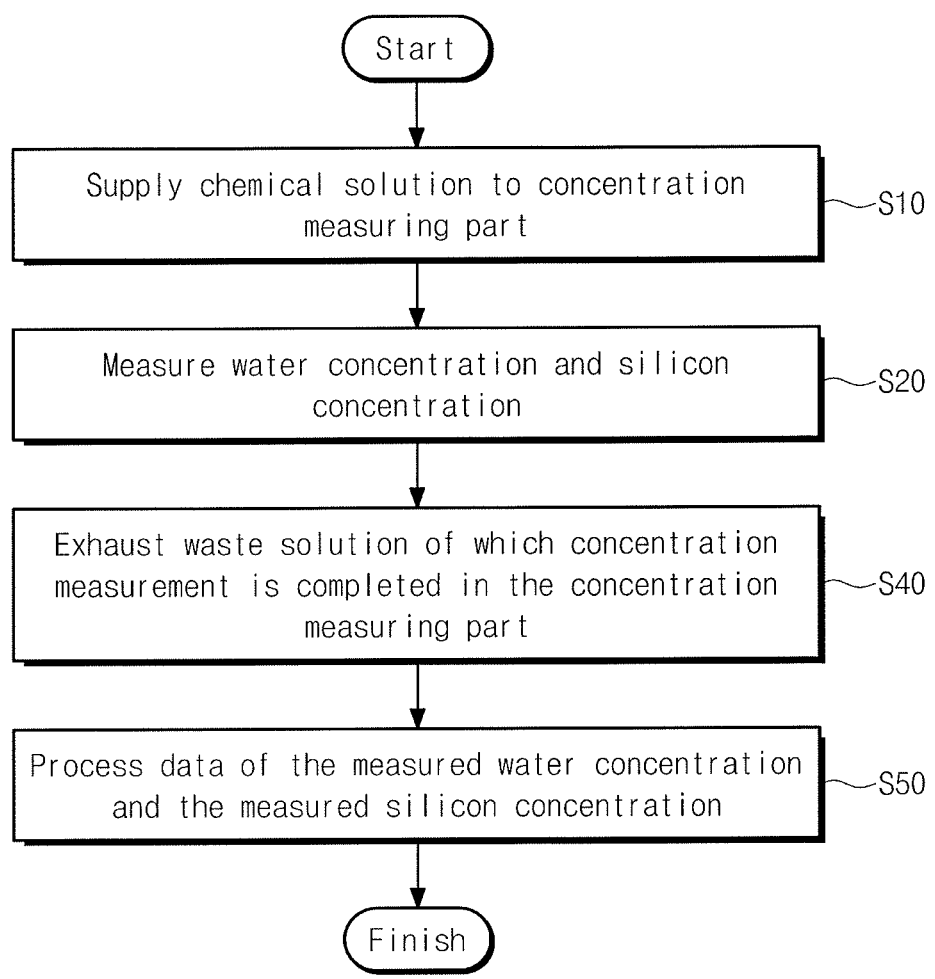
FIG. 4 illustrates a flow chart of a method of treating a substrate according to some embodiments.
Figure 5A:
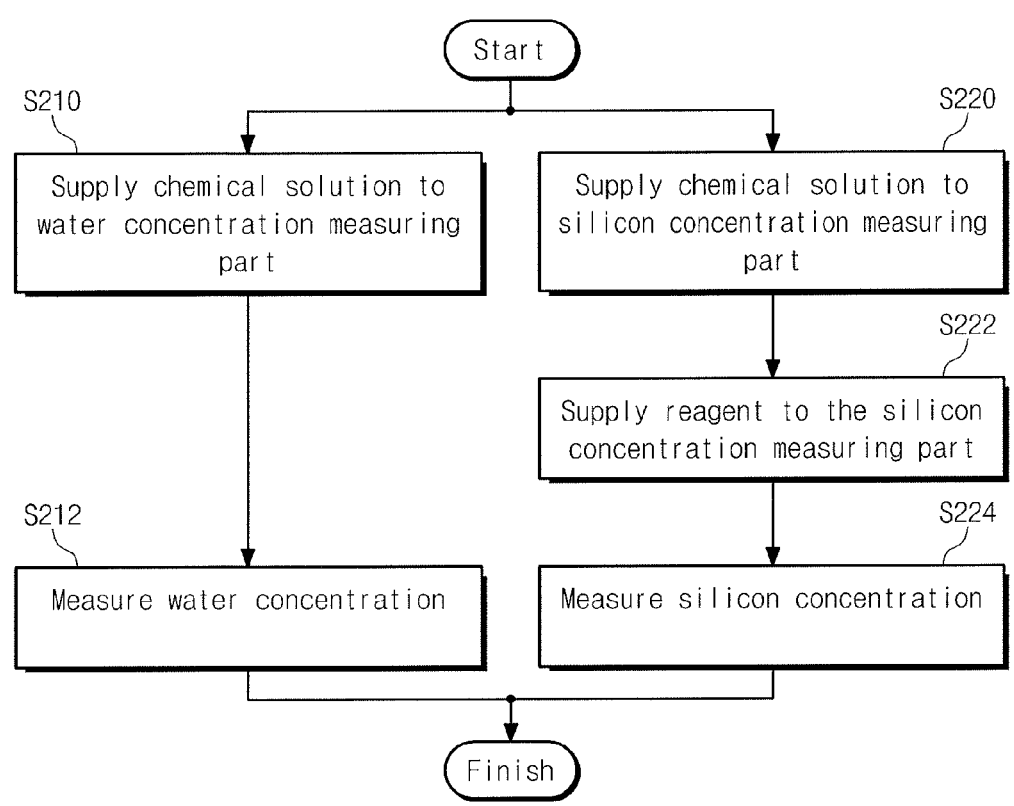
FIG. 5A illustrates a flow chart of a process of measuring a water concentration and a silicon concentration of FIG. 4.
Figure 5B:
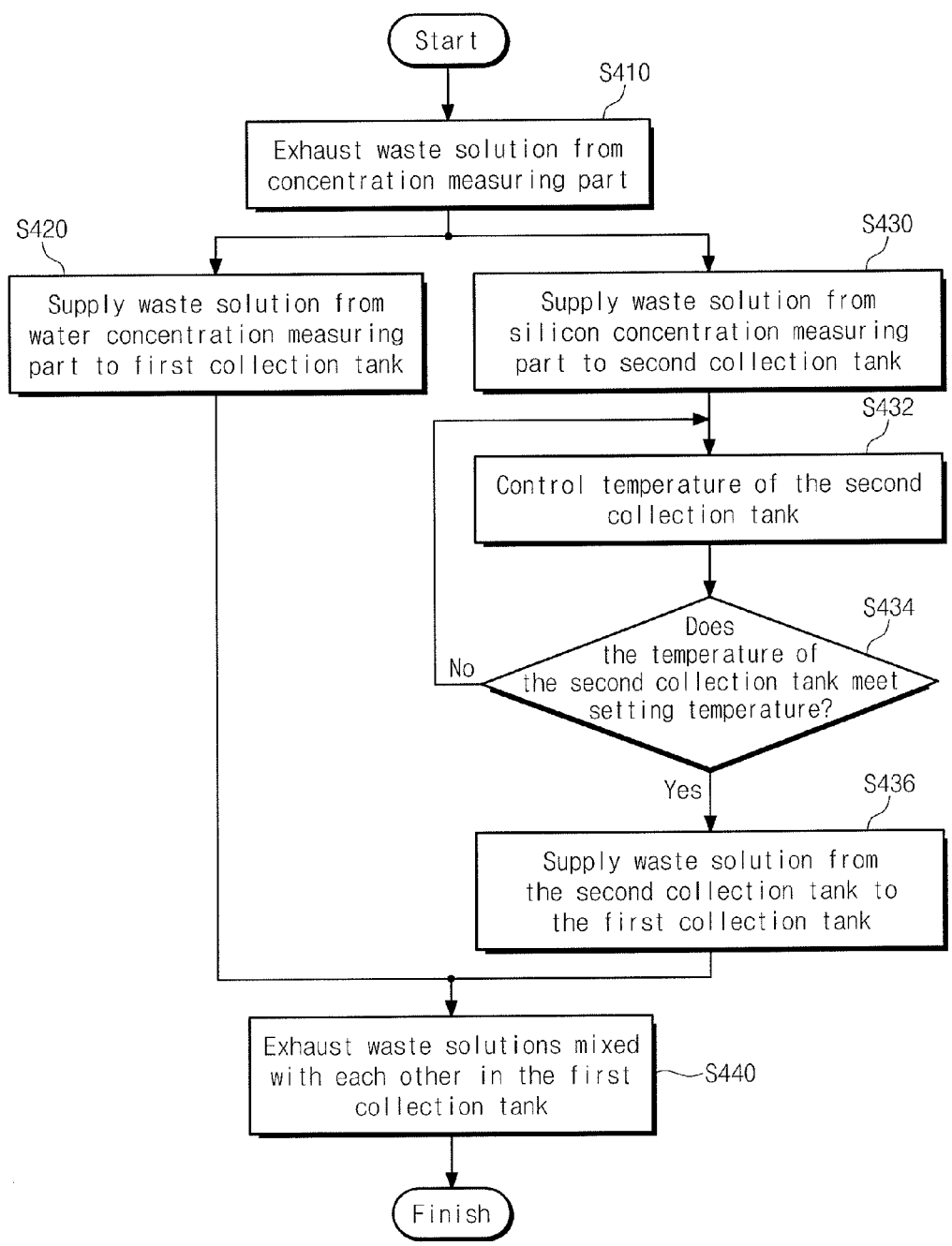
FIG. 5B illustrates a flow chart of a process of exhausting a waste solution of FIG. 4.
Figure 5C:
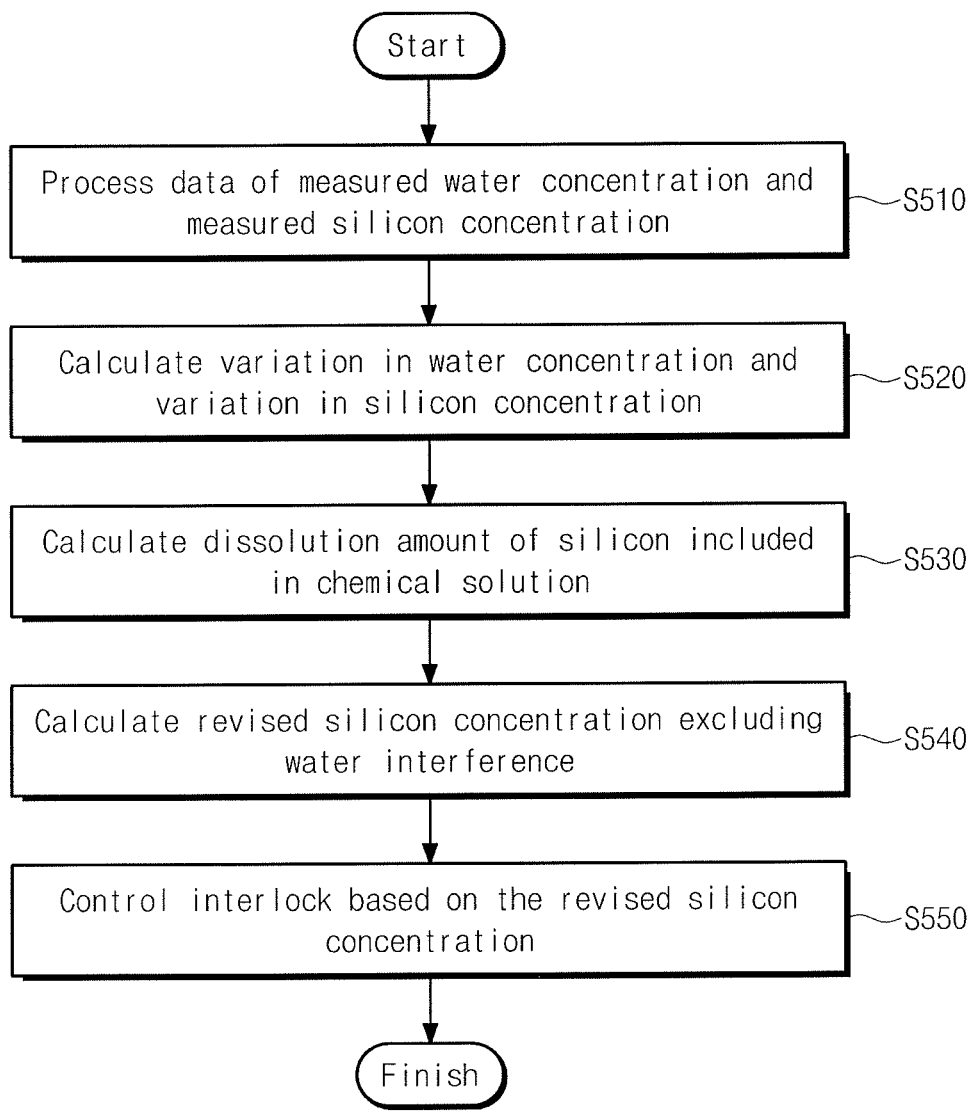
FIG. 5C illustrates a flow chart of a process of processing data of FIG. 4.

FIG. 4 illustrates a flow chart of a method of treating a substrate according to some embodiments. FIG. 5A illustrates a flow chart of a process of measuring a water concentration and a silicon concentration of FIG. 4. FIG. 5B illustrates a flow chart of a process of exhausting a waste solution of FIG. 4. FIG. 5C illustrates a flow chart of a process of processing data of FIG. 4. FIGS. 6A to 6E illustrate views of stages in the method of treating a substrate of FIG. 4. FIGS. 7A and 7B illustrate graphs according to a process of processing data. Hereinafter, a method of treating a substrate will be described with reference to FIGS. 4, 5A to 5C, 6A to 6E, 7A, and 7B. Arrows show a flow of a fluid in FIGS. 6A to 6E. In FIGS. 6A to 6E, closed valves are shown by valves of which the insides are filled with black color, and opened valves are shown by valves of which the insides are empty.

Figure 6A:
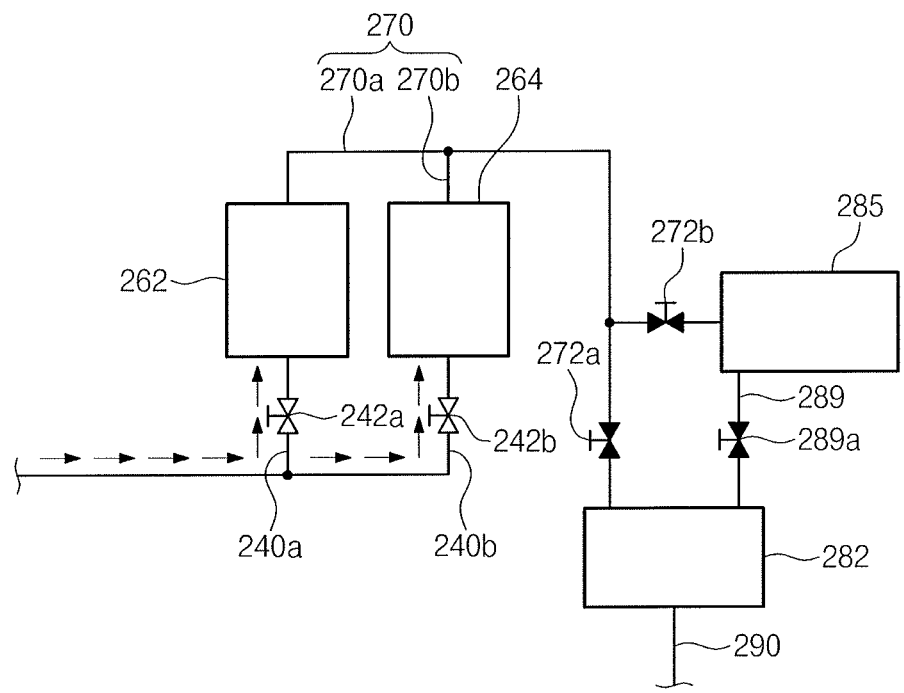
FIGS. 6A to 6E illustrate views of stages in the method of treating a substrate of FIG. 4.
Figure 7A:
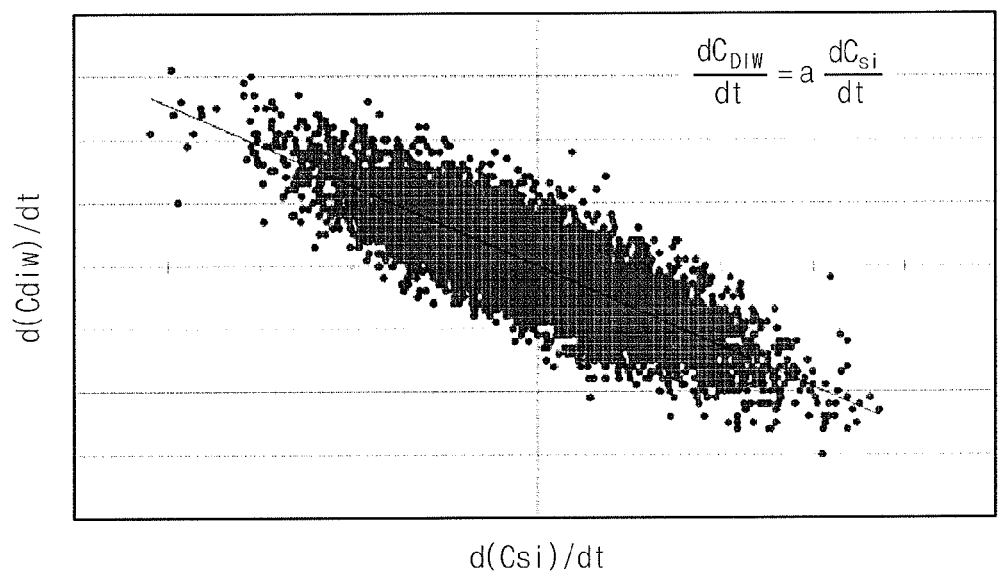
FIGS. 7A and 7B illustrate graphs according to a process of processing data.
Figure 7B:
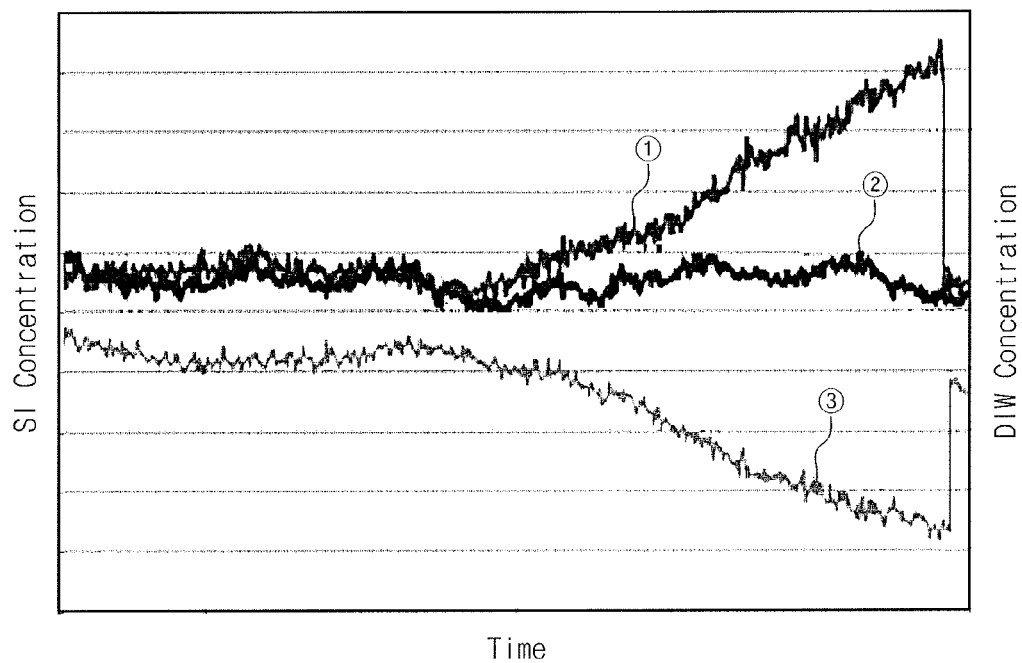

Referring to FIGS. 4, 5A, and 6A, the chemical solution may be supplied into the concentration measuring part 260 through the sampling line 240 (S10). The first sampling valve 242a of the first sampling line 240a and the second sampling valve 242b of the second sampling line 240b may be opened to supply the chemical solution into the first concentration measuring part 262 and the second concentration measuring part 264, respectively.

Figure 6B:
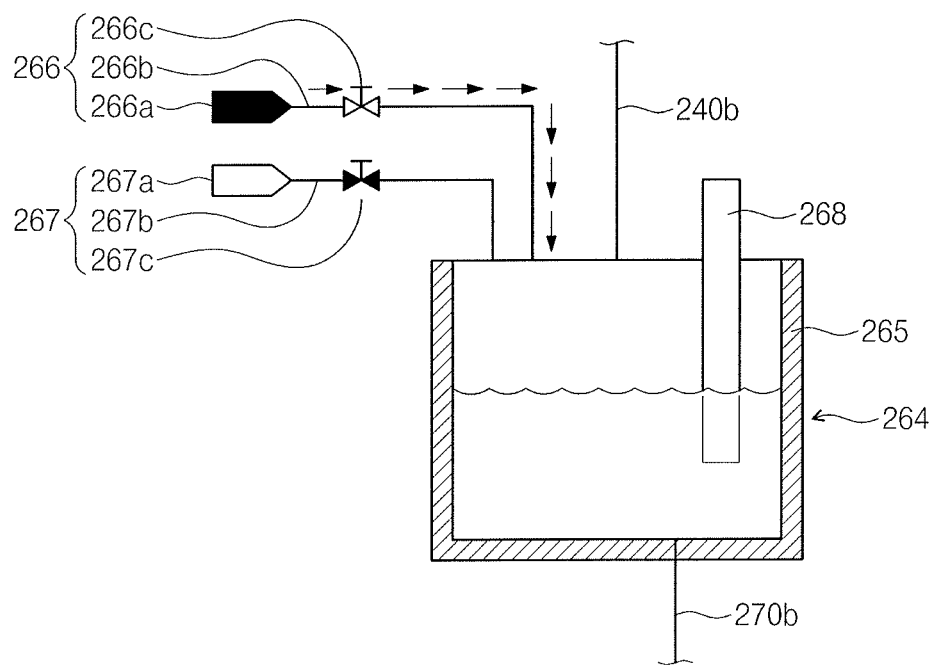
Figure 6C:
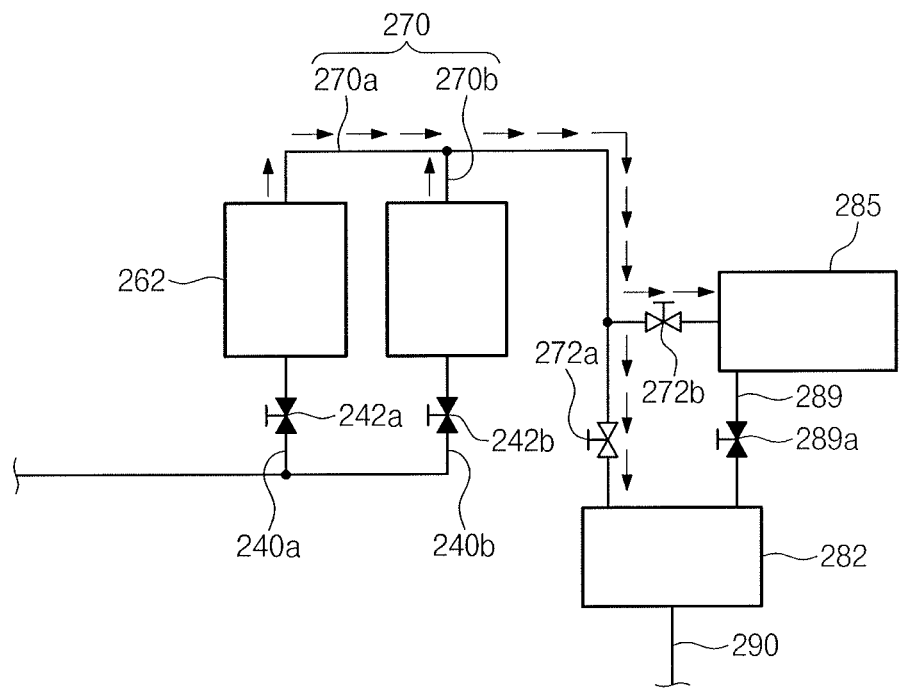
Figure 6D:
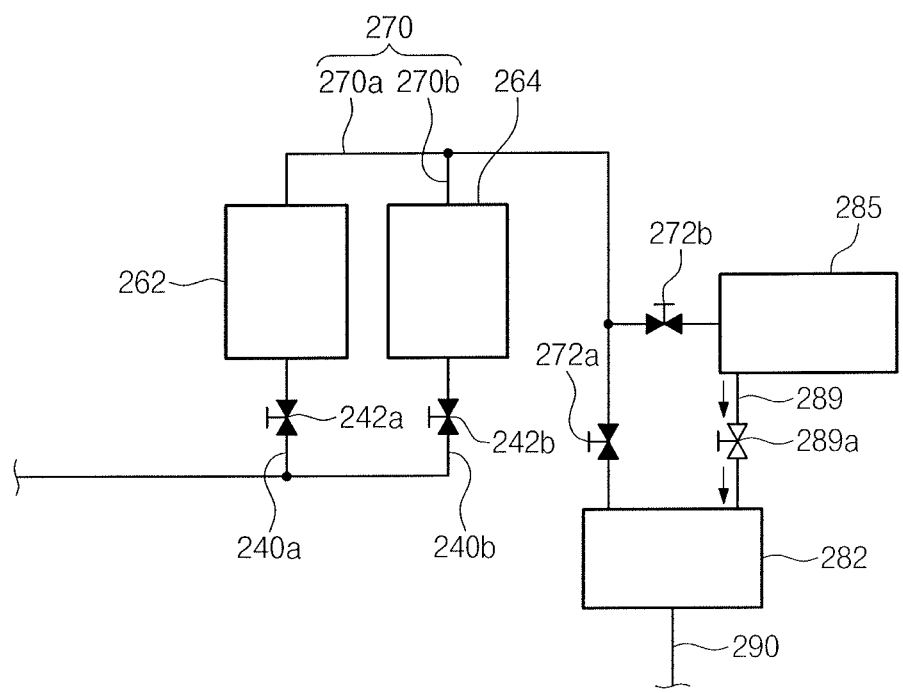
Figure 6E:
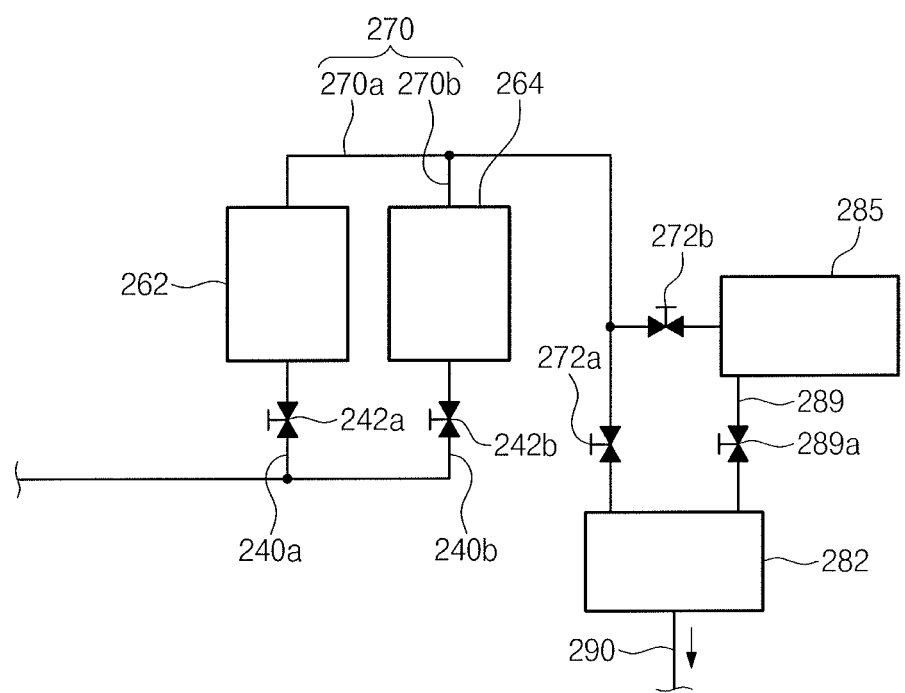

Referring to FIGS. 4, 5A, and 6B, a water concentration and a silicon concentration of the chemical solution may be measured (S20). The first concentration measuring part 262 may measure the water concentration of the chemical solution (S212). The first concentration measuring part 262 may correspond to a water concentration measuring part illustrated in FIGS. 5A and 5B. The first concentration measuring part 262 may include the optical measuring part. For example, the first concentration measuring part 262 may include the optical measuring part using the near-infrared rays. For example, the first concentration measuring part 262 may irradiate the near-infrared rays to the chemical solution and may measure the absorption degree (i.e., the absorbance) from a wavelength band of a near-infrared ray, absorbed by water, among near-infrared rays reflected from the chemical solution. The first concentration measuring part 262 may convert the measured absorbance into a water content to measure the water concentration. The first concentration measuring part 262 may convert the measured water concentration into a concentration of phosphoric acid included in the chemical solution.

The second concentration measuring part 264 may supply the reagent into the chemical solution received in the reactor 265 to measure the silicon concentration of the chemical solution (S222 and S224). The second concentration measuring part 264 may correspond to a silicon concentration measuring part illustrated in FIGS. 5A and 5B. The reagent may react with the chemical solution. The reagent may dissolve silicon included or dispersed in the chemical solution. For example, the reagent may contain fluorine ions. The reagent may include the acid solution. The ratio of the reagent to the chemical solution may range from about 0.5:1 to about 1.5:1. The reagent may be maintained at the setting temperature. The setting temperature may be a temperature capable of dissolving the silicon of the chemical solution. For example, the setting temperature may range from about 35° C. to about 43° C. The measurement electrode 268 may measure the silicon concentration of the chemical solution reacted with the reagent. In some embodiments, the measurement electrode 268 may measure the concentration of the fluorine ions, thus the concentration of the silicon may be back-tracked or determined based on the amount of the fluorine ions reacted with the chemical solution (e.g., based on the total amount of fluorine ions provided to the reactor and the amount of fluorine atoms remaining in the reactor after reacting with the chemical solution). In some embodiments, the measurement electrode 268 may be the electrode of which the potential is varied according to a concentration of silicon ions.

Referring to FIGS. 4, 5B, and 6C to 6E, the waste solution completely measured in the concentration measuring part 260 may be exhausted (S40 and S410). The waste solution may include at least one of the chemical solution, the reagent, or the correction chemical solution. The waste solution measured in the first concentration measuring part 262 may be supplied into the first collection tank 282 through the first collection line 270a (S420). At this time, the waste solution supplied in the first collection tank 282 may include the chemical solution. The waste solution measured in the second concentration measuring part 262 may be supplied into the second collection tank 285 through the second collection line 270b (S430). At this time, the waste solution supplied in the second collection tank 285 may include at least one of the chemical solution, the reagent, or the correction chemical solution. For example, the waste solution exhausted from the second concentration measuring part 264 may be the mixed solution of the chemical solution and the reagent. A temperature of the second collection tank 285 may be controlled such that a temperature of the received waste solution meets a setting or predetermined temperature (S432). The setting temperature may be a temperature at which the reagent included in the waste solution dissolves silicon included in the chemical solution. For example, the setting temperature may range from about 35° C. to about 43° C. When the temperature of the second collection tank 285 meets the setting temperature, the waste solution of the second collection tank 285 may be supplied into the first collection tank 282 (S434 and S436). Thereafter, the waste solutions mixed with each other in the first collection tank 282 may be exhausted to the outside through the exhaust line 290 (S440). By these two exhausting processes, it is possible to help reduce and/or prevent a silicon deposit from being generated in the exhaust line 290 and/or to prevent the exhaust line 290 from being clogged with the silicon deposit.

Referring to FIGS. 4, 5C, 7A, and 7B, the control unit 30 may process data using the measured water concentration and silicon concentration (S510). A mass or amount of the phosphoric acid included in the chemical solution may be constant, but a mass or amount of the silicon included in the chemical solution may increase as the substrate treating process progresses (e.g., as silicon is removed from the substrate). In addition, the substrate treating process may be performed at a high temperature, and an amount of the water included in the chemical solution may vary greatly due to evaporation and inflow of water. Thus, the control unit 30 may calculate a variation in concentration of water and a variation in concentration of silicon using the measured water concentration and silicon concentration of the chemical solution and may calculate the dissolution amount of the silicon included in the chemical solution (S520 and S530). The water of the chemical solution may be deionized water. Referred to FIG. 7A, the following equation 1 may be obtained by the measured and calculated data. As shown in the following equation 1, the concentration variation $d(C_{DIW})/dt$ of the water may be proportional to the concentration variation $d(C_{Si})/dt$ of the silicon. In addition, the dissolution amount $m_{Si}$ of the silicon of the chemical solution may be back-tracked or determined using a gradient a of the concentration variations and the mass $m_{HP}$ of the phosphoric acid included in the chemical solution (see the following equation 2). At this time, the mass $m_{HP}$ of the phosphoric acid may be a predetermined value.

$$\frac{d(C_{DIW})}{dt} = a\frac{d(C_{Si})}{dt} \qquad \text{[Equation 1]}$$

$$a = -\frac{m_{HP}}{m_{Si}} - 1 \qquad \text{[Equation 2]}$$

A revised concentration $C_{Si}(rev)$ of the silicon may be defined using the Equations 1 and 2, as illustrated in the following equation 3 (S540). The revised concentration $C_{Si}(rev)$ of the silicon may refer to a concentration excluding water interference caused according to the concentration variation of the water. The revised concentration $C_{Si}(rev)$ of the silicon may be defined using the measured silicon concentration $C_{Si}$ and a difference between the measured water concentration $C_{DIW}$ and a reference water concentration $C_{DIW}(ref)$. The reference water concentration $C_{DIW}(ref)$ may be set at a predetermined time. For example, the control unit 30 may set a soft-sensor with respect to the revised silicon concentration.

$$C_{Si}(rev) = C_{Si} - \frac{1}{a}(C_{DIW} - C_{DIW}(ref)) \qquad \text{[Equation 3]}$$

Thus, as illustrated in FIG. 7B, the control unit 30 may display the measured silicon concentration ①, the measured water concentration ②, and the revised silicon concentration ③. The control unit 30 may set an interlock signal based on the measured silicon concentration ①, the measured water concentration ②, and the revised silicon concentration ③. For example, the control unit 30 may set a first setting range of the measured silicon concentration ① and may generate a first interlock signal when the measured silicon concentration ① is beyond or outside of the first setting range. In addition, the control unit 30 may set a second setting range of the revised silicon concentration ③ and may generate a second interlock signal when the revised silicon concentration ③ is beyond or outside of the second setting range. The control unit 30 may set the first and second interlock signals in such a way that the first and second interlock signals overlap with each other. In an implementation, the control unit 30 may generate the interlock signal based on the measured water concentration ② or a temperature in the substrate treating apparatus 1. As a result, it is possible to easily monitor and/or control the substrate treating apparatus 1 using the chemical solution, and the reliability of the substrate treating apparatus 1 may be improved.

Figure 8:
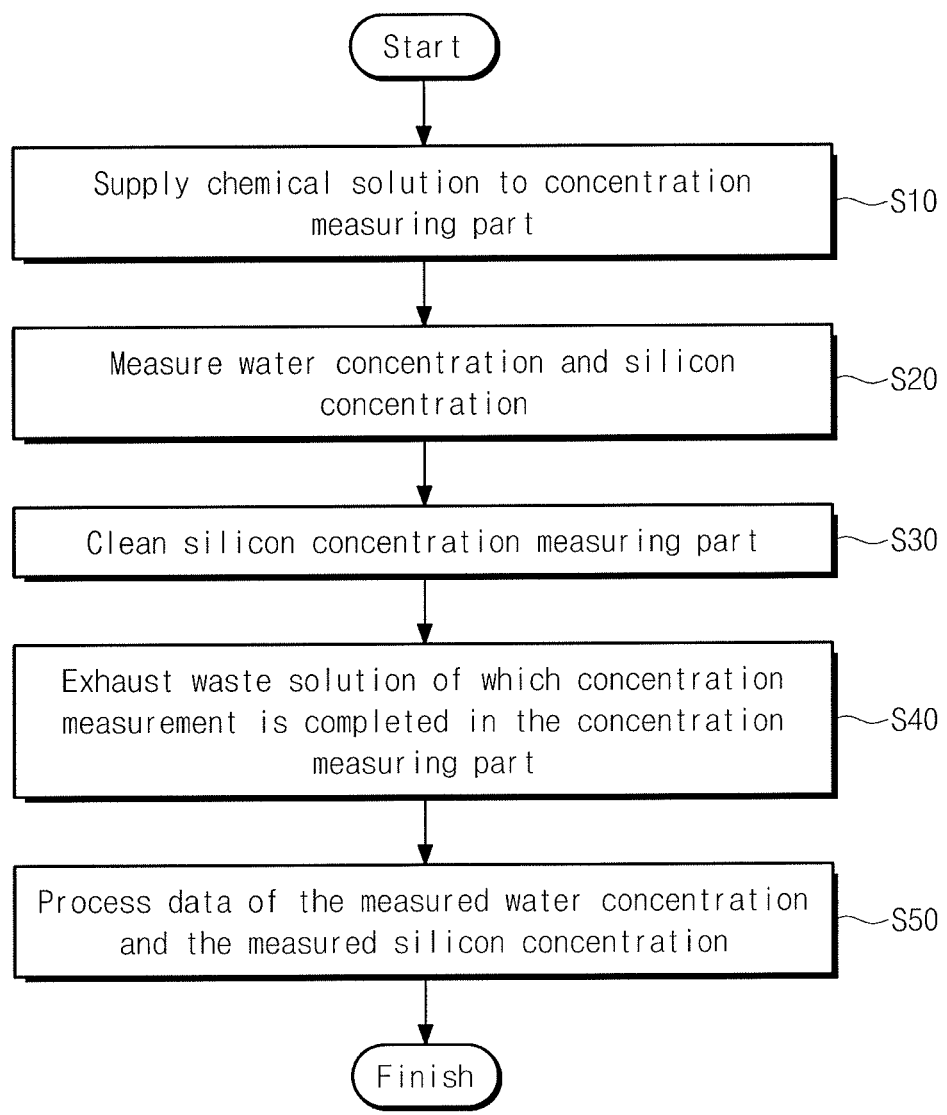
FIG. 8 illustrates a flow chart of a method of treating a substrate according to some embodiments.
Figure 9A:
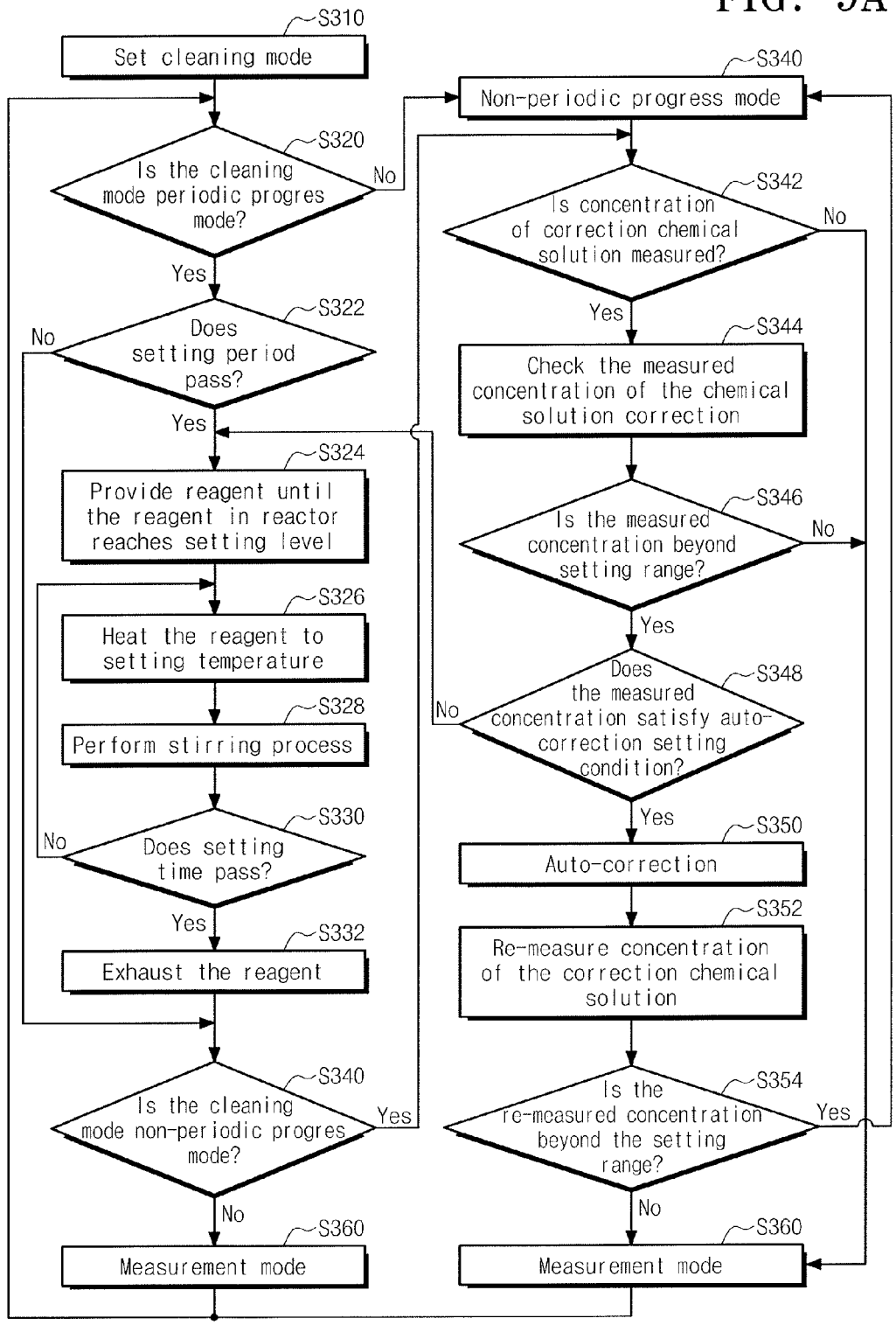
FIG. 9A illustrates a flow chart of a process of cleaning a silicon concentration measuring part of FIG. 8.
Figure 9B:
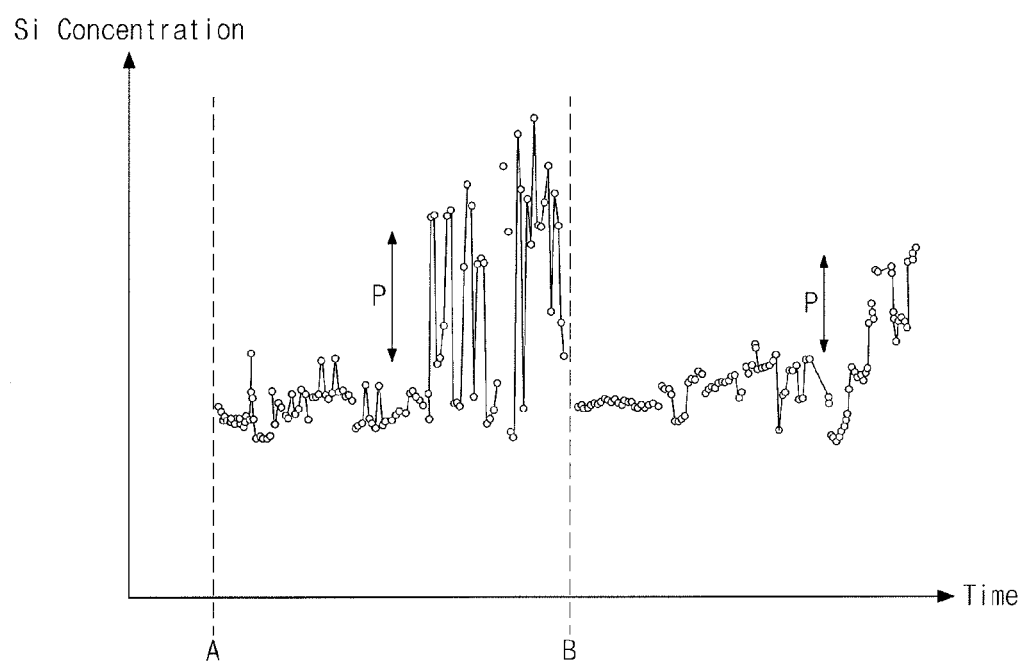
FIG. 9B illustrates a graph of a trend of a measured silicon concentration.

FIG. 8 illustrates a flow chart of a method of treating a substrate according to some embodiments. FIG. 9A illustrates a flow chart of a process of cleaning a silicon concentration measuring part of FIG. 8. FIG. 9B illustrates a graph of a trend of a measured silicon concentration. Hereinafter, a method of treating a substrate will be described with reference to FIGS. 8, 9A and 9B. Steps S10, S20, S40, and S50 of the substrate treating method of FIG. 8, except a step S30 of cleaning the silicon concentration measuring part, may be the same as or similar to the steps S10, S20, S40, and S50 described with reference to FIGS. 4, 5A to 5C, 6A to 6E, 7A, and 7B. Thus, in the present embodiment, the same descriptions as in the embodiments of FIGS. 4, 5A to 5C, 6A to 6E, 7A, and 7B may be omitted or mentioned briefly for the purpose of ease and convenience in explanation.

Referring to FIGS. 8 and 9A, the second concentration measuring part 264 (i.e., the silicon concentration measuring part 264) may be cleaned in response to a control signal of the control unit 30 before, during, or after the measurement of the silicon concentration (S30). The control unit 30 may control the silicon concentration measuring part 264 in such a way that a mode of the silicon concentration measuring part 264 is switched between a measurement mode and a cleaning mode. In the measurement mode, the silicon concentration measuring part 264 may measure the silicon concentration. In the cleaning mode, the inside of the silicon concentration measuring part 264 may be cleaned. In some embodiments, the control unit 30 may control the silicon concentration measuring part 264 such that the silicon concentration measuring part 264 may be periodically or non-periodically cleaned. The control unit 30 may set the cleaning mode of the silicon concentration measuring part 264 to one of a periodic progress mode and a non-periodic progress mode (S310).

When the cleaning mode is set to the periodic progress mode, the control unit 30 may set a setting period and may determine whether cleaning of the silicon concentration measuring part 264 is performed according to whether the setting period passes (S320 and S322). When the setting period passes, the control unit 30 may control the concentration measuring part 260 such that a reagent may be provided into the reactor 265 until the reagent in the reactor 265 reaches a setting level (S324). The reagent may dissolve silicon remaining in the reactor 265. In addition, the reagent may dissolve silicon particles formed on the measurement electrode 268. For example, the reagent may contain fluorine ions. The reagent may include an acid solution. The reagent may be heated to a setting temperature (S326). For example, the setting temperature may range about 35° C. to about 43° C. A stirring process may be performed to smoothly perform the reaction between the reagent and the silicon (S328). When a setting time passes, the control unit 30 may control the substrate treating apparatus 1 to exhaust the reagent through the second collection tank 285 (S330 and S332). The setting time may range from about 15 minutes to about 30 minutes.

When the cleaning mode is set to the non-periodic progress mode, the control unit 30 may control the concentration measuring part 260 such that a correction chemical solution may be provided into the reactor 265 (S340). The correction chemical solution may be the same as the chemical solution. Concentrations of the correction chemical solution may be equal to or different from those of the chemical solution. The correction chemical solution may contain silicon having a predetermined concentration (i.e., the reference concentration). The control unit 30 may control the concentration measuring part 260 to measure a silicon concentration of the correction chemical solution supplied in the reactor 265 (S342 and S344). When the measured silicon concentration of the correction chemical solution is beyond or outside of a predetermined reference concentration range, cleaning of the silicon concentration measuring part 264 is required. Thus, when the measured silicon concentration of the correction chemical solution is beyond or outside of the reference concentration range, the control unit 30 may control the concentration measuring part 260 to supply the reagent into the correction chemical solution of the reactor 265 (S346 and S324). Thereafter, the cleaning process using the reagent may be performed as described in the steps S328, S330, and S332. When the measured silicon concentration of the correction chemical solution is beyond or outside of the reference concentration range and satisfies an auto-correction setting condition, auto-correction may be performed (S346, S348, and S350). The auto-correction may include zero-point correction. After the auto-correction is completed, a silicon concentration of the correction chemical solution may be re-measured (S352). When the re-measured silicon concentration is beyond the reference concentration range, the control unit 30 may continuously perform the cleaning process. On the contrary, when the re-measured silicon concentration is in the reference concentration range, the control unit 30 may complete the cleaning process and may switch the silicon concentration measuring part 260 to the measurement mode (S360).

Referring to FIG. 9B, a trend of the concentration measured by the silicon concentration measuring part 264 may be graphed. In FIG. 9B, a line A and a line B indicate time points at the cleaning process of the silicon concentration measuring part 264 is performed. At this time, it is recognized that differences between measured silicon concentration values may occur as a measuring time of the silicon concentration measuring part 264 (i.e., a circulating time of the chemical solution) increases. For example, a peak P of the measured silicon concentration values may occur at a specific time point. In addition, the measured silicon concentration value may be corrected immediately after the cleaning process is performed on the silicon concentration measuring part 264. Thus, it is recognized that the cleaning process of the silicon concentration measuring part 264 may be needed. Furthermore, a cleaning period of the silicon concentration measuring part 264 may be set using this trend by the control unit 30.

The cleaning process of the silicon concentration measuring part 264 may be performed, and silicon accumulated in the reactor 265 may be removed. In addition, silicon particles formed on the surface of the measurement electrode 268 may also be removed. Thus, it is possible to help prevent a measurement error of the measured silicon concentration, and the reliability of the substrate treating apparatus 1 may be improved.

By way of summation and review, in an etching process, it may be desirable to maintain a high etch selectivity between an etch target layer and another layer and to minimize defects caused by reaction by-products generated during the etching process. Thus, an etching composition may be capable of improving an etch selectivity between different layers and of reducing occurrence of unnecessary reaction by-products. For example, when the etching process is performed using a chemical solution including a phosphoric acid aqueous solution and a high-concentration silicon compound, a layer disposed on a substrate may be etched to increase a silicon content in the chemical solution as the etching process progresses. In this case, abnormal growth could occur on the substrate and/or trouble or malfunction of equipment may be caused by a silicon deposit occurring in the equipment.

In the embodiments described above, the chemical solution for performing the etching process on a substrate is described as an example. In an implementation, the embodiments may be applied to various processes of treating a substrate using a mixed chemical solution. In addition, in the above embodiments, the chemical solution including the phosphoric acid aqueous solution and the silicon compound is described as an example. In an implementation, the chemical solution may include other constituents. Moreover, the process of treating a substrate using the chemical solution including the silicon compound of a high content at a high temperature is described as an example in the above embodiments. In an implementation, the embodiments may be applied to various chemical solution supply units supplying a chemical solution under the same condition.

According to some embodiments, the silicon concentration and the water concentration of the chemical solution may be measured, and such measurement data may be used to control the silicon concentration. In some embodiments, the revised silicon concentration, which excludes the interference of the water, may be obtained based on the variation in the measured water concentration and the variation in the measured silicon concentration. Thus, it is possible to accurately control the silicon concentration of the chemical solution and to help reduce and/or prevent the abnormal growth that may occur on a substrate by the high-concentration silicon. In addition, the silicon concentration may be increased during the process by the chemical solution which includes the high-concentration silicon and may be controlled or maintained at a high temperature, the silicon concentration of the chemical solution may be controlled by cleaning the silicon concentration measuring part and/or by the agent reaction of the exhaust operation. As a result, it is possible to reduce and/or prevent trouble or malfunction of the apparatus from occurring by a silicon deposit formed in the apparatus. In addition, the measurement error of the silicon concentration may be reduced and/or prevented.

The embodiments may provide an apparatus and method of treating a substrate using a chemical solution including a phosphoric acid aqueous solution and a silicon compound.

The embodiments may provide an apparatus and method of treating a substrate, which are capable of measuring both a silicon concentration and a water concentration.

The embodiments may provide an apparatus and method of treating a substrate, which are capable of preventing system trouble or system malfunction caused by a silicon deposit when a chemical solution including a high-temperature and high-concentration silicon compound is used.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of treating a substrate, the method comprising:
    supplying a chemical solution to a substrate in a bath to perform a process on the substrate, the chemical solution having a first temperature and including a silicon compound and a phosphoric acid aqueous solution;
    circulating the chemical solution;
    sampling at least a portion of the circulated chemical solution;
    measuring a water concentration and a silicon concentration of the sampled chemical solution having a second temperature lower than the first temperature; and
    calculating a revised silicon concentration of the chemical solution in the bath at the first temperature based on the water concentration and the silicon concentration of the sampled chemical solution at the second temperature.

2. The method as claimed in claim 1, wherein the revised silicon concentration is calculated according to a gradient of a variation in the measured silicon concentration to a variation in measured water concentration and excluding an interference according to a water variation in the bath.

3. The method as claimed in claim 2, wherein an interlock signal is generated when the revised silicon concentration is beyond a predetermined setting range.

4. The method as claimed in claim 2, wherein:
    a first setting range of the measured silicon concentration is set,
    a second setting range of the revised silicon concentration is set,
    a first interlock signal is generated when the measured silicon concentration is beyond the first setting range, and
    a second interlock signal is generated when the revised silicon concentration is beyond the second setting range.

5. The method as claimed in claim 1,
    wherein the first temperature is 150° C. to 200° C., and
    wherein the second temperature is 35° C. to 43° C.

6. A method of treating a substrate, the method comprising:
    supplying a chemical solution to a substrate in a bath to perform a process on the substrate, the chemical solution having a first temperature including a silicon compound and a phosphoric acid aqueous solution;
    circulating the chemical solution;
    sampling at least a portion of the circulated chemical solution;
    measuring a water concentration and a silicon concentration of the sampled chemical solution having a second temperature lower than the first temperature; and
    calculating a revised silicon concentration of the chemical solution in the bath at the first temperature based on the water concentration and the silicon concentration of the sampled chemical solution at the second temperature,
    wherein measuring the silicon concentration includes preventing a measurement error of the silicon concentration and preventing a silicon deposit, which occur by the silicon concentration increasing during the process.

7. The method as claimed in claim 6, wherein measuring the silicon concentration includes:
  supplying a reagent that dissolves silicon, and
  measuring a potential difference of ions of silicon dissolved by the reagent.

8. The method as claimed in claim 7, wherein preventing the measurement error of the silicon concentration includes periodically or non-periodically cleaning a silicon concentration measurer that measures the silicon concentration.

9. The method as claimed in claim 8, wherein cleaning the silicon concentration measurer includes supplying the reagent to the silicon concentration measurer.

10. The method as claimed in claim 9, further comprising exhausting the chemical solution after measuring the water concentration and the silicon concentration,
  wherein the chemical solution used to measure the water concentration is exhausted independently of a mixed solution of the reagent and the chemical solution used to measure the silicon concentration.

11. The method as claimed in claim 10, wherein:
  the mixed solution is heated to a predetermined temperature to additionally dissolve silicon,
  the mixed solution is mixed with the chemical solution used to measure the water concentration after heating the mixed solution, and
  the mixed solutions are exhausted.

12. The method as claimed in claim 6, wherein the chemical solution includes the silicon compound in a concentration of about 80 ppm to about 1,000 ppm.

13. A method of treating a substrate, the method comprising:
  supplying a chemical solution to a substrate in a bath to perform a process on the substrate, the chemical solution having a first temperature and including a silicon compound and a phosphoric acid aqueous solution;
  circulating the chemical solution;
  sampling at least a portion of the circulated chemical solution;
  measuring a water concentration and a silicon concentration of the sampled chemical solution having a second temperature lower than the first temperature; and
  calculating a revised silicon concentration of the chemical solution in the bath at the first temperature based on the water concentration and the silicon concentration of the sampled chemical solution at the second temperature,
  wherein:
  performing the process on the substrate increases the silicon concentration of the chemical solution, and
  measuring the silicon concentration includes cleaning a silicon concentration measurer that measures the silicon concentration.

14. The method as claimed in claim 13, wherein the revised silicon concentration is calculated according to a gradient of a variation in the measured silicon concentration to a variation in measured water concentration and excluding an interference according to a water variation in the bath.

15. The method as claimed in claim 14, wherein an interlock signal is generated when the revised silicon concentration is beyond a predetermined setting range.

16. The method as claimed in claim 14, wherein:
  a first setting range of the measured silicon concentration is set,
  a second setting range of the revised silicon concentration is set,
  a first interlock signal is generated when the measured silicon concentration is beyond the first setting range, and
  a second interlock signal is generated when the revised silicon concentration is beyond the second setting range.

17. The method as claimed in claim 1,
  wherein the first temperature is 150° C. to 200° C., and
  wherein the second temperature is 35° C. to 43° C.

18. The method as claimed in claim 13, wherein measuring the silicon concentration further includes:
  supplying a reagent that dissolves silicon, and
  measuring a potential difference of ions of silicon dissolved by the reagent.

* * * * *